(12) United States Patent
Sakai

(10) Patent No.: US 8,991,052 B2
(45) Date of Patent: Mar. 31, 2015

(54) METHOD OF MANUFACTURING LIQUID EJECTING HEAD, METHOD OF MANUFACTURING LIQUID EJECTING APPARATUS AND METHOD OF MANUFACTURING PIEZOELECTRIC ELEMENT

(71) Applicant: Seiko Epson Corporation, Tokyo (JP)

(72) Inventor: Tomohiro Sakai, Chino (JP)

(73) Assignee: Seiko Epson Corporation (JP)

(*) Notice: Subject to any disclaimer, the term of this patent is extended or adjusted under 35 U.S.C. 154(b) by 298 days.

(21) Appl. No.: 13/707,035

(22) Filed: Dec. 6, 2012

(65) Prior Publication Data

US 2013/0145589 A1   Jun. 13, 2013

(30) Foreign Application Priority Data

Dec. 8, 2011  (JP) ................. 2011-269352

(51) Int. Cl.
*B21D 53/00* (2006.01)
*H01L 41/22* (2013.01)
*B41J 2/16* (2006.01)
*H01L 41/187* (2006.01)
*H01L 41/318* (2013.01)
*H01L 41/319* (2013.01)
*B41J 2/14* (2006.01)

(52) U.S. Cl.
CPC ............ *H01L 41/22* (2013.01); *B41J 2/161* (2013.01); *B41J 2/1645* (2013.01); *H01L 41/1878* (2013.01); *H01L 41/318* (2013.01); *H01L 41/319* (2013.01); *B41J 2/14233* (2013.01); *B41J 2/1646* (2013.01); *B41J 2202/03* (2013.01)

USPC ............ 29/890.1; 29/25.35; 29/593; 347/54; 347/68; 347/69; 347/70; 347/71

(58) Field of Classification Search
USPC ............ 29/25.35, 593, 890.1; 347/20, 54, 68, 347/69, 70, 71, 72
See application file for complete search history.

(56) References Cited

U.S. PATENT DOCUMENTS

| 8,783,838 | B2 * | 7/2014 | Sakai et al. | 347/71 |
| 8,820,894 | B2 * | 9/2014 | Sakai | 347/68 |
| 2007/0241642 | A1 | 10/2007 | Miyazawa et al. | |
| 2013/0145589 | A1 * | 6/2013 | Sakai | 29/25.35 |
| 2013/0187990 | A1 * | 7/2013 | Sakai et al. | 347/71 |
| 2013/0250006 | A1 * | 9/2013 | Sakai | 347/68 |
| 2014/0292948 | A1 * | 10/2014 | Sakai | 347/71 |

FOREIGN PATENT DOCUMENTS

| JP | 2001-223404 | 8/2001 |
| JP | 2007-287745 | 11/2007 |
| JP | 2013201407 A * | 10/2013 |

* cited by examiner

*Primary Examiner* — Paul D Kim
(74) *Attorney, Agent, or Firm* — Harness, Dickey & Pierce, P.L.C.

(57) ABSTRACT

A method of manufacturing a liquid ejecting head includes forming a first electrode made of platinum, forming a buffer layer made of a compound having a pyrochlore structure that contains bismuth or platinum on the first electrode, forming an oxide layer made of an oxide containing bismuth on the buffer layer, forming a piezoelectric layer made of a compound having a perovskite structure that contains bismuth by burning the oxide layer, and forming a second electrode on the piezoelectric layer.

5 Claims, 14 Drawing Sheets

AFTER BUFFER
LAYER FORMATION

Pt(111)  (222)

AFTER PIEZOELECTRIC
LAYER FORMATION

AFTER BUFFER
LAYER FORMATION

AFTER PIEZOELECTRIC
LAYER FORMATION

AFTER BUFFER
LAYER FORMATION

AFTER PIEZOELECTRIC
LAYER FORMATION

AFTER BUFFER LAYER FORMATION

AFTER PIEZOELECTRIC LAYER FORMATION

AFTER BUFFER
LAYER FORMATION

AFTER PIEZOELECTRIC
LAYER FORMATION

METHOD OF MANUFACTURING LIQUID EJECTING HEAD, METHOD OF MANUFACTURING LIQUID EJECTING APPARATUS AND METHOD OF MANUFACTURING PIEZOELECTRIC ELEMENT

The entire disclosure of Japanese Patent Application No. 2011-269352, filed on Dec. 8, 2011 is incorporated by reference herein.

BACKGROUND

1. Technical Field

The present invention relates to a method of manufacturing a liquid ejecting head which is provided with a piezoelectric layer made of a piezoelectric material and a piezoelectric element having an electrode to discharge a liquid droplet from a nozzle opening, a method of manufacturing a liquid ejecting apparatus and a method of manufacturing a piezoelectric element.

2. Related Art

As a representative example of a liquid ejecting head, for example, there is an ink jet type recording head in which a part of a pressure generating chamber which communicates with a nozzle to discharge a liquid droplet is formed of a vibration plate and the vibration plate is deformed by a piezoelectric element to pressurize ink in the pressure generating chamber, such that the ink droplet is discharged from the nozzle. As a piezoelectric element used in an ink jet type recording head, there is a piezoelectric element in which a piezoelectric layer (piezoelectric film) made of a piezoelectric material having an electromechanical transduction function, for example, a crystallized dielectric material interposed between two electrodes.

Since high piezoelectric properties are demanded for the piezoelectric material used as the piezoelectric layer forming the piezoelectric element, a representative example of the piezoelectric material may be lead zirconate titanate (PZT) as a representative example (refer to JP-A-2001-223404). However, there has been demand for a piezoelectric material without lead or which has a reduced lead content from the viewpoint of environmental problems. As a piezoelectric material not containing lead, for example, there is a BiFeO$_3$-based piezoelectric material which contains Bi and Fe (for example, refer to JP-A-2007-287745).

However, a piezoelectric layer made of a complex oxide without lead or which has a reduced lead content has a problem of low crystallinity. When the piezoelectric layer has low crystallinity, for example, a problem such as a small amount of displacement occurs. Furthermore, the problem of low crystallinity is not limited to the BiFeO$_3$-based piezoelectric material, a bismuth-based piezoelectric material which contains bismuth also has the same problem. Moreover, such a problem exists not only in an ink jet type recording head, but also in other liquid ejecting heads which discharge liquid droplets other than ink. In addition, such a problem also exists in a piezoelectric element used for apparatuses other than a liquid ejecting head.

SUMMARY

An advantage of some aspects of the invention is to provide a method of manufacturing a liquid ejecting head having a piezoelectric layer which has a reduced environmental load and high crystallinity, a method of manufacturing a liquid ejecting apparatus and a method of manufacturing a piezoelectric element.

According to an aspect of the invention, there is provided a method of manufacturing a liquid ejecting head including forming a first electrode made of platinum, forming a buffer layer made of a compound having a pyrochlore structure that contains bismuth or platinum on the first electrode, forming an oxide layer made of an oxide containing bismuth on the buffer layer, forming a piezoelectric layer made of a compound having a perovskite structure that contains bismuth by burning the oxide layer, and forming a second electrode on the piezoelectric layer.

According to the aspect of the invention, it is possible to manufacture the liquid ejecting head having the piezoelectric layer with high crystallinity in such a manner that the buffer layer having a pyrochlore structure that contains bismuth or platinum is formed and the oxide layer made of an oxide containing bismuth on the buffer layer is burned to form a piezoelectric layer. In addition, the environmental load can be reduced due to having no leaded or a reduced lead amount.

It is preferable that the buffer layer be made of a compound in which Bi is positioned in an A site and Pt is positioned in a B site in the pyrochlore structure. According to the aspect, it is possible to easily form the buffer layer made of a compound having a pyrochlore structure that contains bismuth or platinum.

According to another aspect of the invention, there is provided a method of manufacturing a liquid ejecting apparatus including manufacturing a liquid ejecting head by the method of manufacturing a liquid ejecting head. According to the aspect, it is possible to provide a liquid ejecting apparatus in which the environmental load is reduced and piezoelectric properties (amount of displacement) are excellent.

According to still another aspect of the invention, there is provided a method of manufacturing a piezoelectric element including forming a first electrode made of platinum, forming a buffer layer made of a compound having a pyrochlore structure that contains bismuth or platinum on the first electrode, forming an oxide layer made of an oxide containing bismuth on the buffer layer, forming a piezoelectric layer made of a compound having a perovskite structure that contains bismuth by burning the oxide layer, and forming a second electrode on the piezoelectric layer. According to the aspect, it is possible to manufacture the piezoelectric element having the piezoelectric layer with high crystallinity in such a manner that the buffer layer having a pyrochlore structure that contains bismuth or platinum is formed and the oxide layer made of an oxide containing bismuth on the buffer layer is burned to form a piezoelectric layer. In addition, an environmental load can be reduced due to having no lead or a reduced lead amount.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
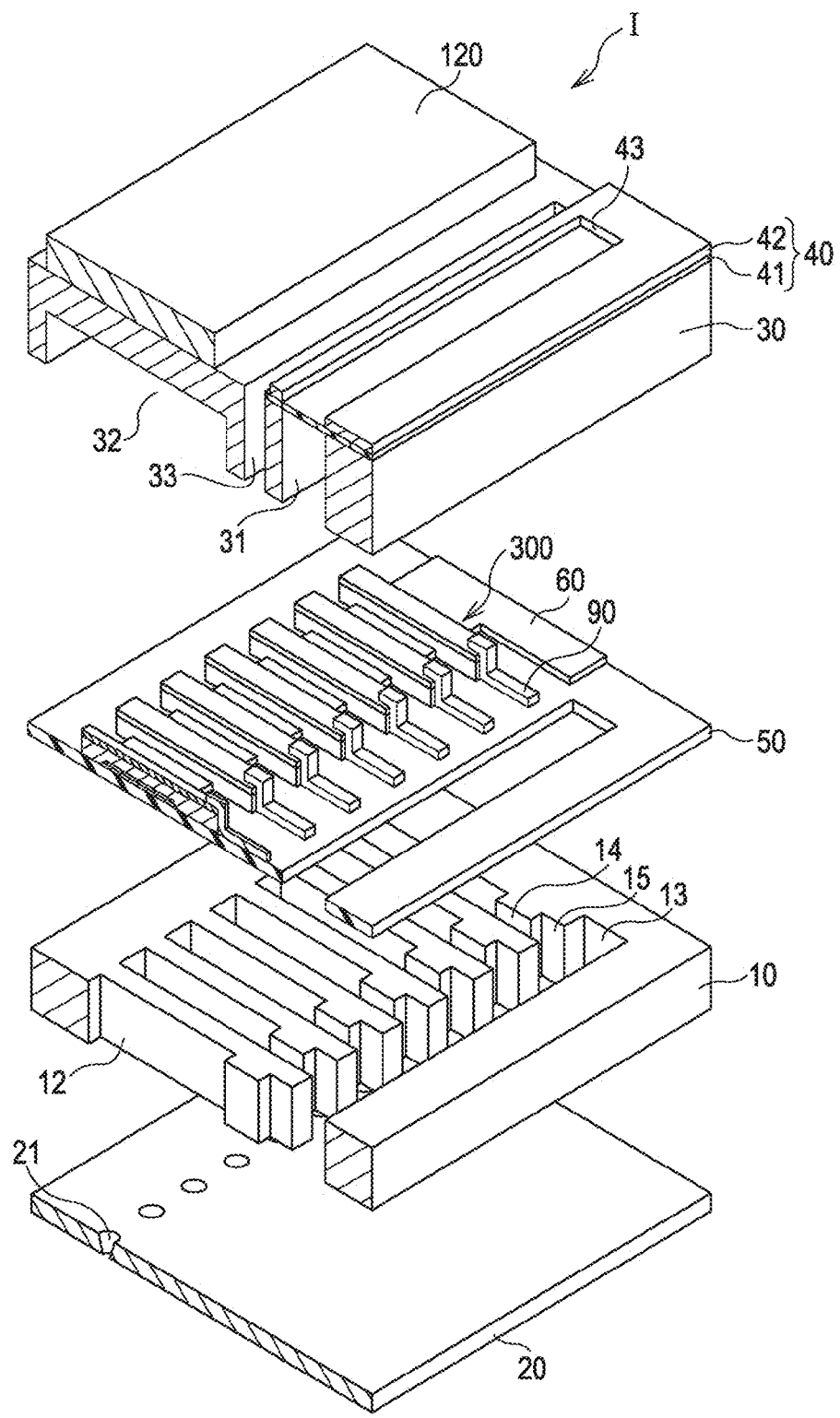
FIG. 1 is a schematic exploded perspective view of a recording head according to Embodiment 1.
Figure 2:
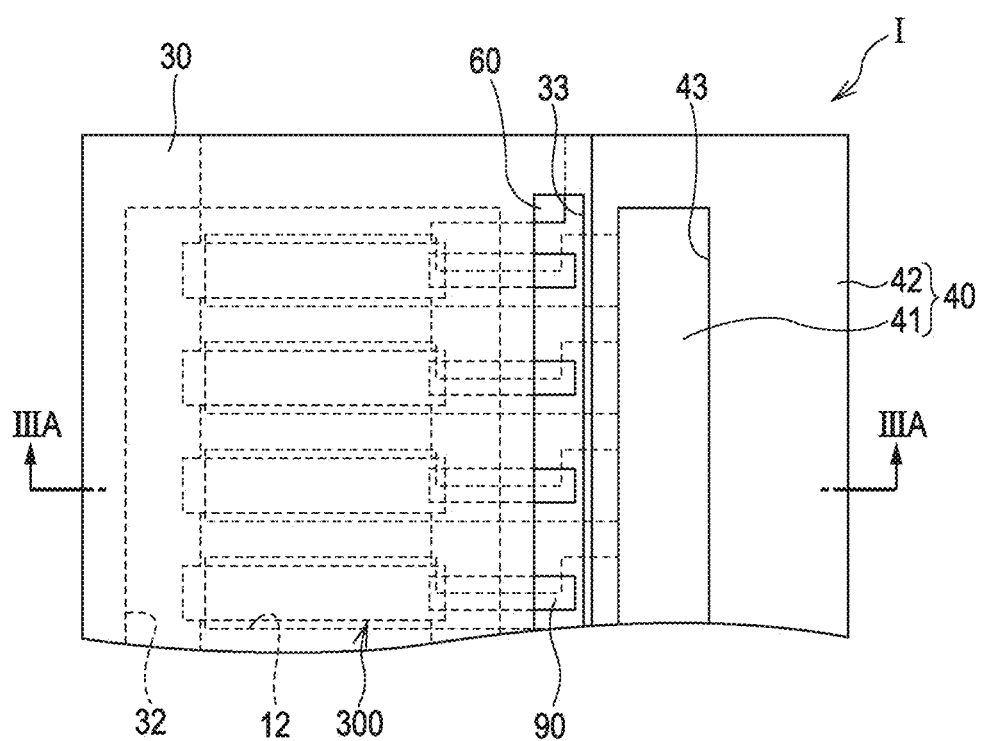
FIG. 2 is a plan view of the recording head according to Embodiment 1.
Figure 3A:
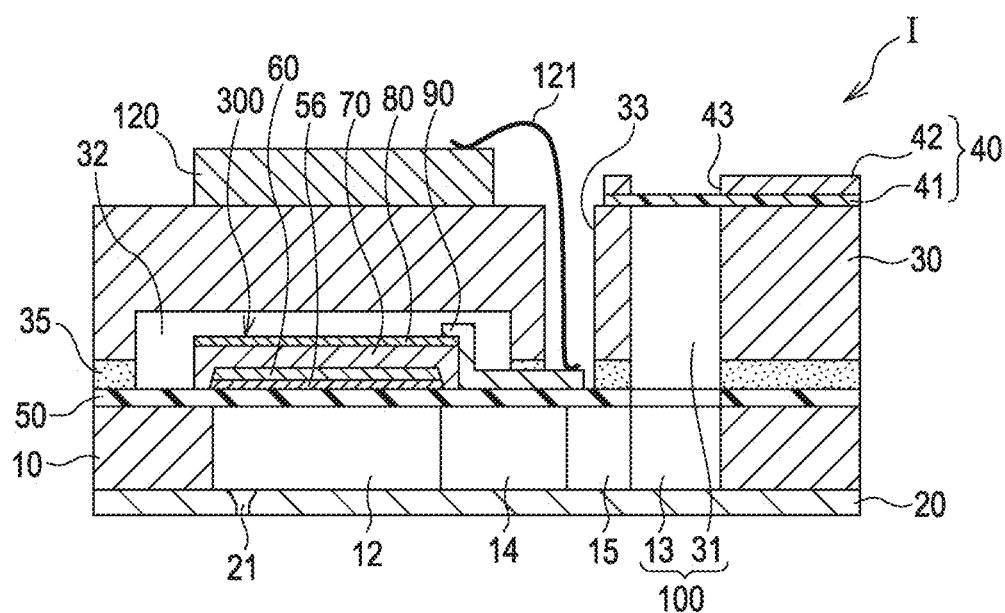
FIG. 3A is a cross-sectional view.
Figure 3B:
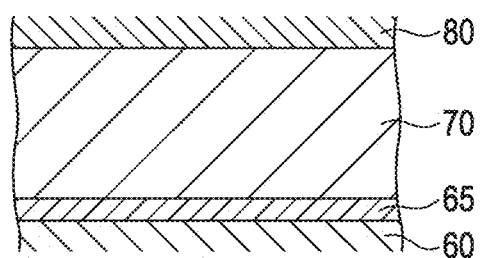
FIG. 3B is an enlarged cross-sectional view of a main part of the recording head according to Embodiment 1.

FIG. 1 is a schematic exploded perspective view of an ink jet type recording head as an example of a liquid ejecting head manufactured by a method according to Embodiment 1 of the invention. FIG. 2 is a plan view of FIG. 1, FIG. 3A is a cross-sectional view of the recording head taken along the line IIIA-IIIA of FIG. 2 and FIG. 3B is an enlarged cross-sectional view of a main part of the recording head of FIG. 3A. As shown in FIGS. 1 to 3B, a flow passage forming substrate 10 according to the embodiment is a silicon single crystal substrate and an elastic film 50 made of silicon dioxide is formed on one surface of the flow passage forming substrate.

On the flow passage forming substrate 10, plural pressure generating chambers 12 are provided in parallel in the width direction thereof. In addition, a communication portion 13 is formed in a region outside of the pressure generating chambers 12 of the flow passage forming substrate 10 in a longitudinal direction and the communication portion 13 communicates with the respective pressure generating chambers 12 through an ink supply path 14 and a communication path 15 each of which is provided in every pressure generating chamber 12. The communication portion 13 which communicates with a manifold portion 31 of a protective substrate described below and forms a part of a manifold which is a common ink chamber of the respective pressure generating chambers 12. The ink supply path 14 is formed to have a smaller width than the pressure generating chamber 12, and maintains a constant resistance in the flow passage against ink flowing from the communication portion 13 to the pressure generating chamber 12. While the width of each flow passage is narrowed on one side surface in the embodiment to form the ink supply path 14, the width of each flow passage may be narrowed at both sides thereof to form the ink supply paths. Moreover, instead of narrowing the width of the flow passages, the ink supply paths may be formed by narrowing the flow passages from the thickness direction. In the embodiment, the flow passage forming substrate 10 is provided with liquid flow passages, which are formed with the pressure generating chambers 12, the communication portion 13, the ink supply path 14, and the communication path 15.

A nozzle plate 20 in which each of nozzle openings 21 is punctured in communication with vicinity of an end portion of each pressure generating chamber 12 opposite to the ink supply path 14 is fixed to an opening surface of the flow passage forming substrate 10 with an adhesive, a heat-seal film, or the like. For example, the nozzle plate 20 may be made of glass ceramic, a silicon single crystal substrate, or stainless steel.

On the other hand, the elastic film 50 is formed on the opposite side of the opening surface of the flow passage forming substrate 10, as described above. On the elastic film 50, an adhesion layer 56 made of a titanium oxide and having a thickness of, for example, approximately 30 to 50 nm is provided in order to improve the adhesiveness of the elastic film 50 and the like with the foundation of a first electrode 60. Meanwhile, an insulating film made of zirconium oxide may also be provided on the elastic film 50 as necessary.

Furthermore, piezoelectric elements 300 are disposed on the adhesion layer 56. Each piezoelectric element 300 in which the first electrode 60 made of platinum (Pt), a buffer layer burning layer 65 which is formed by burning a buffer layer 64 made of a compound having a pyrochlore structure described later in detail, a piezoelectric layer 70 which is a thin film and a second electrode 80 are laminated so as to configure the piezoelectric element 300 as a pressure generating unit that causes the pressure generating chambers 12 to generate changes in the pressure. Here, the piezoelectric element 300 refers to a part which includes the first electrode 60, the piezoelectric layer 70 and the second electrode 80. In general, any one of the electrodes in the piezoelectric element 300 forms a common electrode, and the other electrode and the piezoelectric layer 70 are patterned for each of the pressure generating chambers 12. In the embodiment, while the first electrode 60 is used as the common electrode of the piezoelectric element 300 and the second electrode 80 is used as the individual electrode of the piezoelectric element 300, the functions of the first and second electrodes may be reversed for the sake of convenience of the driving circuit and wiring. In addition, an actuator apparatus mentioned herein is defined by a combination of the piezoelectric element 300 and a vibration plate that is displaced by the driving of the piezoelectric element 300. Although in the above example, the elastic film 50, the adhesion layer 56, the first electrode 60, and the insulating film optionally provided function as a vibration plate, the structure of the vibration plate is not limited to the above structure and, for example, the elastic film 50 or the adhesion layer 56 may not be provided. Moreover, the piezoelectric element 300 itself may function as a vibration plate in substance.

In the embodiment, the buffer layer burning layer 65 is made of an oxide having a perovskite structure that contains bismuth (Bi) or platinum (Pt). For example, the buffer layer burning layer 65 may be made of a bismuth-based ferrite complex oxide having a perovskite structure that contains Bi and Fe and containing Pt. Furthermore, in the perovskite structure, that is, in an $ABO_3$ structure, an A site is coordinated with 12 oxygen atoms and a B site is coordinated with 6 oxygen atoms so as to form an octahedron. In case of bismuth ferrite, Bi is positioned in the A site and Fe is positioned in the B site.

Here, the bismuth-based ferrite complex oxide having the perovskite structure is an existing piezoelectric material and materials having various composition has been known. For example, other than $BiFeO_3$, a composition in which some of elements (Bi, Fe and O) are deficient or excessive, or some of the elements are substituted with another element is known as bismuth ferrite. However, when "bismuth ferrite" is noted in the invention, the compositions shifted from the stoichiometric composition ($BiFeO_3$) due to excess or deficiency of the elements (Bi, Fe, O) are also included in a range of bismuth ferrite as long as there are no changes in the basic properties.

As a specific example of the buffer layer burning layer 65, there may be a buffer layer burning layer made of a compound containing Bi, Pt, Fe, and Co, a buffer layer burning layer made of a compound containing Bi, Pt, Fe and Na and a buffer layer burning layer made of a compound containing Bi, Pt, Fe and Mg.

The buffer layer burning layer 65 containing Bi, Pt, Fe and Co has a structure in which Pt is added to a complex oxide having a perovskite structure of a mixed crystal of bismuth ferrite and bismuth cobaltate or a structure in which Pt is added to a solid solution in which bismuth ferrite and bismuth cobaltate are uniformly solid-soluted. In addition, for example, the buffer layer burning layer 65 containing Bi, Pt, Fe and Na has a structure in which Na and Pt are added to bismuth ferrite. Then, for example, the buffer layer burning layer 65 containing Bi, Pt, Fe and Mg has a structure Mg and Pt are added to bismuth ferrite. In an X-ray diffraction pattern, bismuth ferrite and bismuth cobaltate are not detected alone.

While the buffer layer burning layer 65 is made of a compound having a perovskite structure in the embodiment, the buffer layer burning layer 65 may be made of a compound not having a perovskite structure. For example, there may be the state of the buffer layer 64 described later, that is, a pyrochlore structure as it is. However, when the buffer layer burning layer 65 is made of a compound having a perovskite structure, since the piezoelectric material can be favorably displaced, it is preferable that the buffer layer burning layer 65 be made of a compound having a perovskite structure.

The piezoelectric layer 70 provided on the buffer layer burning layer 65 is a piezoelectric material made of a compound having a perovskite structure that contains bismuth. Specifically, there may be a bismuth-based ferrite complex oxide and a bismuth-based titanate complex oxide having perovskite structures. In the perovskite structure, that is, in the $ABO_3$ structure, the A site is coordinated with 12 oxygen atoms and the B site is coordinated with 6 oxygen atoms so as to form an octahedron. In a case of bismuth ferrite, Bi and Ba are positioned in the A site and Fe and Ti are positioned in the B site. Examples of bismuth-based ferrite include bismuth ferrite ($BiFeO_3$), bismuth ferrite aluminate ($Bi(Fe,Al)O_3$), bismuth ferrite manganate ($Bi(Fe,Mn)O_3$), bismuth lanthanum ferrite manganate (($Bi,La)(Fe,Mn)O_3$), bismuth barium ferrite manganate titanate (($Bi,Ba)(Fe,Mn,Ti)O_3$), bismuth ferrite cobaltate ($Bi(Fe, Co)O_3$), bismuth cerium ferrite (($Bi, Ce)FeO_3$), bismuth cerium ferrite manganate (($Bi, Ce)(Fe, Mn)O_3$), bismuth lanthanum cerium ferrite (($Bi,La, Ce)FeO_3$), bismuth lanthanum cerium ferrite manganate (($Bi, La, Ce)(Fe,Mn)O_3$), bismuth samarium ferrite (($Bi,Sm) FeO_3$), bismuth ferrite chromate ($Bi(Cr,Fe)O_3$), bismuth potassium ferrite manganate titanate (($Bi,K)(Fe,Mn,Ti)O_3$), and bismuth barium ferrite manganate zincate titanate (($Bi, Ba)(Fe,Mn,Zn,Ti)O_3$). Examples of bismuth-based titanate include bismuth sodium potassium titanate (($Bi,Na,K)TiO_3$), bismuth barium sodium titanate zincate (($Bi,Na,Ba)(Zn,Ti) O_3$), or bismuth barium sodium titanate cuprate (($Bi,Na,Ba) (Cu,Ti)O_3$). In addition, examples of the bismuth-based titanate include bismuth potassium titanate (($Bi,K)TiO_3$), or bismuth chromate ($BiCrO_3$). In addition, for example, $Bi(Zn_{1/2}Ti_{1/2})O_3$, $(Bi_{1/2}K_{1/2})TiO_3$, $(Bi_{1/2}Na_{1/2})TiO_3$, and (Li, Na, K) (Ta Nb) $O_3$ may be added to the above-described complex oxides. In the embodiment, the piezoelectric layer 70 is made of a complex oxide having a perovskite structure that contains Bi, Fe, Ba and Ti.

The complex oxide having a perovskite structure that contains Bi, Fe, Ba and Ti is a complex oxide having a perovskite structure of a mixed crystal of bismuth ferrite and barium titanate or a solid solution in which bismuth ferrite and barium titanate are uniformly solid-soluted. In an X-ray diffraction pattern, bismuth ferrite and barium titanate are not detected alone. Here, bismuth ferrite and barium titanate are existing piezoelectric materials respectively having a perovskite structure and various compositions thereof are respectively known. For example, other than $BiFeO_3$ and $BaTiO_3$, compositions in which some of elements (Bi, Fe, Ba, Ti and O) are deficient or excessive, or some of the elements are substituted with other element are known as bismuth ferrite and barium titanate. However, when "bismuth ferrite and barium titanate" are noted in the invention, compositions shifted from the stoichiometric composition due to excess or deficiency of the elements are also included in ranges of bismuth ferrite and barium titanate as far as there are no changes in the basic properties. In addition, the ratio of bismuth manganate ferrite and barium titanate can be variously changed.

The composition of the piezoelectric layer 70 made of a complex oxide having a perovskite structure that contains Bi, Fe, Ba and Ti and, for example, can be represented as a mixed crystal represented by the following general formula (1). Moreover, the general formula (1) can be represented as the following general formula (1'). Here, the general formula (1) and the general formula (1') are composition notations represented on the basis of the stoichiometric composition and as described above, and an inevitable shift of the compositions due to a lattice mismatch, oxygen deficiency, substitution of some elements or the like is permitted as far as a perovskite structure can be obtained. For example, when a stoichiometric composition ratio is 1, a composition in the range of 0.85 to 1.20 is permitted. In addition, in the case of being represented by the following general formulae, other compounds can be considered as the same complex oxide when the ratio of the element in the A site and the element in the B site are the same.

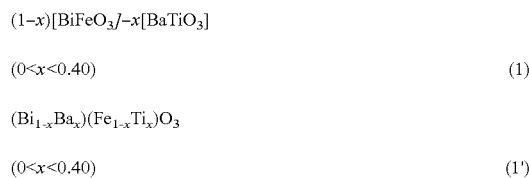

When the complex oxide forming the piezoelectric layer 70 contains Bi, Fe, Ba and Ti, elements other than Bi, Fe, Ba and Ti may be contained. Examples of other elements include Mn, Co and Cr. Naturally, when a complex oxide contains other elements, the complex oxide is necessary to have a perovskite structure. When the piezoelectric layer 70 contains Mn, Co and Cr, a complex oxide has a structure in which Mn, Co and Cr are positioned in the B site. For example, in case where a complex oxide contains Mn, it has been found that while the complex oxide forming the piezoelectric layer 70 is represented as a structure in which some Fe in the solid solution in which bismuth ferrite and barium titanate are uniformly solid-soluted is substituted with Mn, or a complex oxide having a perovskite structure of a mixed crystal of bismuth manganate ferrite and barium titanate and the basic properties are the same as the complex oxide having the perovskite structure of the mixed crystal of bismuth ferrite and barium titanate, the leakage properties are improved. Moreover, when the piezoelectric layer 70 contains Co or Cr, the leakage properties are improved similar to the case of Mn. In the X-ray diffraction patterns, bismuth ferrite, barium titanate, bismuth ferrite manganate, bismuth ferrite cobaltate and bismuth ferrite chromate are not detected alone. While Mn, Co and Cr are exemplified, it has been found that the leakage properties are improved even in case where 2 elements among other transition metal elements are included at the same time. The piezoelectric layer 70 can include the elements and, further, may include other existing additives to improve properties.

The piezoelectric layer 70 made of the complex oxide having the perovskite structure that contains Bi, Fe, Ba and Ti as well as Mn, Co and Cr, for example, is a mixed crystal represented by the following general formula (2). In addition, the general formula (2) can be represented by the following formula (2'). In the general formula (2) and the general formula (2'), M is Mn, Co or Cr. Here, the general formula (2) and the general formula (2') are composition notations represented on the basis of the stoichiometric composition and, as described above, and an inevitable shift of the compositions due to a lattice mismatch, oxygen deficiency, substitution of some elements or the like is permitted as far as a perovskite structure can be obtained. For example, when a stoichiometric composition ratio is 1, a composition in the range of 0.85 to 1.20 is permitted. In addition, in the case of being represented by the following general formulae, other compounds can be considered as the same complex oxide when the ratio of the element in the A site and the element in the B site are the same.

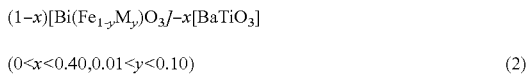

$(1-x)[Bi(Fe_{1-y}M_y)O_3]-x[BaTiO_3]$ $(0<x<0.40, 0.01<y<0.10)$ (2)

$(Bi_{1-x}Ba_x)((Fe_{1-y}M_y)_{1-x}Ti_x)O_3$ $(0<x<0.40, 0.01<y<0.10)$ (2')

The thickness of the buffer layer burning layer 65 or the thickness of the piezoelectric layer 70 is not limited. For example, the thickness of the buffer layer burning layer 65 is 10 nm to 200 nm. In addition, the thickness of the piezoelectric layer 70 is, for example, 3 μm or less, preferably 0.3 to 1.5 nm.

A lead electrode 90 which made of, for example, gold (Au), and which is drawn from the vicinity of the end portion of the ink supply path 14 side and extends on the elastic film 50 or on the insulating film provided as necessary is connected to each second electrode 80 which is the individual electrode of the piezoelectric element 300.

The protective substrate 30 having the manifold portion 31 which configures at least a part of a manifold 100 is bonded on the flow passage forming substrate 10 on which the piezoelectric element 300 is formed, that is, on the first electrode 60, the elastic film 50 or the insulating film provided as necessary, and the lead electrode 90 using an adhesive 35. In the embodiment, the manifold portion 31 penetrates the protective substrate 30 in the thickness direction, is formed along the width direction of the pressure generating chambers 12, and is communicated with the communication portion 13 of the flow passage forming substrate 10 as described above, so as to configuring the manifold 100 that is the common ink chamber of the pressure generating chambers 12. Moreover, only the manifold portion 31 may be used as the manifold by dividing the communication portion 13 of the flow passage forming substrate 10 into plural portions for each of the pressure generating chambers 12. Furthermore, for example, the ink supply path 14 communicating the manifold 100 and each of the pressure generating chambers 12 to members interposed between the flow passage forming substrate 10 and the protective substrate 30 (for example, the elastic film 50, the insulating film provided as necessary, and the like) may be provided by providing only the pressure generating chambers 12 in the flow passage forming substrate 10.

In addition, a piezoelectric element supporting portion 32 having a space which does not hinder the movement of the piezoelectric element 300 is provided in a region in the protective substrate 30 which faces the piezoelectric element 300. The piezoelectric element supporting portion 32 has a space which does not hinder the movement of the piezoelectric element 300, and the space may be sealed or may not be sealed.

It is preferable to use materials having substantially the same coefficient of thermal expansion as the flow passage forming substrate 10, for example, glass, ceramics, and like, as the protective substrate 30, and the protective substrate was formed using a silicon single crystal substrate made of the same material as the flow passage forming substrate 10 in the embodiment.

In addition, a through hole 33 that penetrates the protective substrate 30 in the thickness direction is provided in the protective substrate 30. In addition, the through hole is provided so that the vicinity of the end portion of the lead electrode 90 which is drawn from each of the piezoelectric elements 300 is exposed in the through hole 33.

Furthermore, a driving circuit 120 is fixed to the protective substrate 30 to drive the piezoelectric elements 300 provided in parallel. It is possible to use, for example, a circuit substrate, a semiconductor integrated circuit (IC) and the like as the driving circuit 120. In addition, the driving circuit 120 and the lead electrode 90 are electrically connected through a connecting wire 121 formed with a conductive wire such as a bonding wire.

A compliance substrate 40 formed with a sealing film 41 and a fixing plate 42 is bonded on the protective substrate 30. Here, the sealing film 41 is made of a material having low rigidity and flexibility, and one surface of the manifold portion 31 is sealed by the sealing film 41. In addition, the fixing plate 42 is formed of a relatively hard material. Since the region of the fixing plate 42 facing the manifold 100 forms an opening portion 43 that is fully removed in the thickness direction, the one surface of the manifold 100 is sealed only by the sealing film 41 having flexibility.

In the ink jet type recording head I of the embodiment, an ink is imported from an ink introducing port which is connected to an external ink supplying unit (not shown), the inside from the manifold 100 to the nozzle openings 21 is filled with the ink, a voltage is applied between each pair of the first electrode 60 and the second electrode 80 corresponding to the pressure generating chamber 12 according to recording signals from the driving circuit 120, and the elastic film 50, the adhesion layer 56, the first electrode 60, the buffer layer burning layer 65 and the piezoelectric layer 70 are bent so as to increase the pressure in each pressure generating chamber 12 and discharge ink droplets from the nozzle openings 21.

Next, an example of the method of manufacturing the ink jet type recording head of the embodiment will be described with reference to FIGS. 4A to 8B. Furthermore, FIGS. 4A to 8B are cross-sectional views of the pressure generating chamber in the longitudinal direction.

Figure 4A:
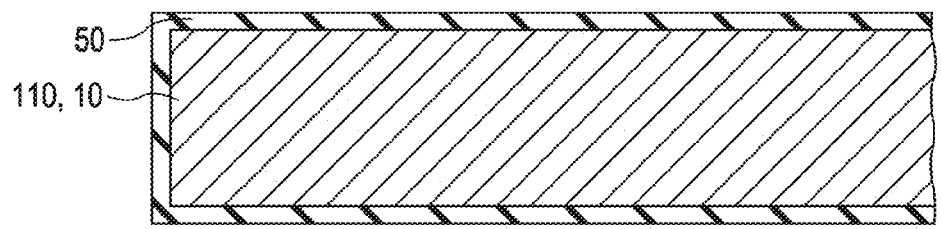
FIGS. 4A and 4B are cross-sectional views showing a process of manufacturing the recording head according to Embodiment 1.
Figure 4B:
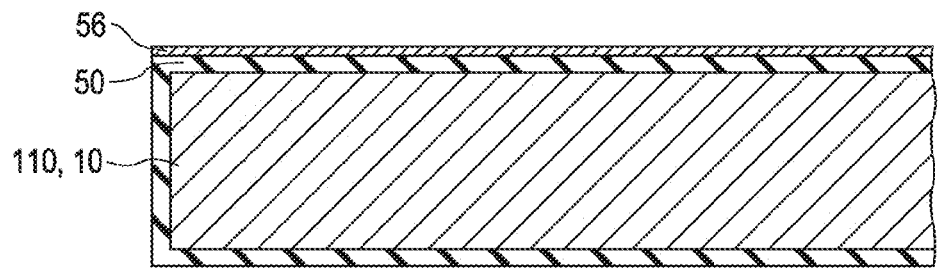

Firstly, as shown in FIG. 4A, a silicon dioxide film made of silicon dioxide ($SiO_2$) or the like composing the elastic film 50 is formed on the surface of a flow passage forming substrate wafer 110 which is a silicon wafer, by thermal oxidation or the like. Next, as shown in FIG. 4B, the adhesion layer 56 made of titanium oxide or the like is formed on the elastic film 50 (silicon dioxide film) by the sputtering method, thermal oxidation, or the like.

Figure 5A:
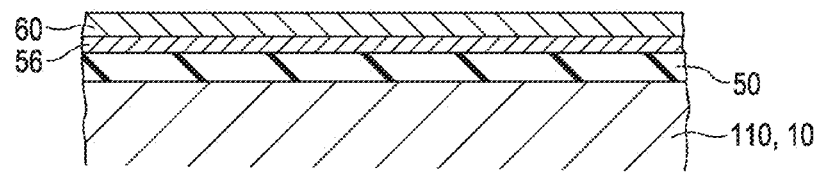
FIGS. 5A to 5D are cross-sectional views showing a process of manufacturing the recording head according to Embodiment 1.
Figure 5B:
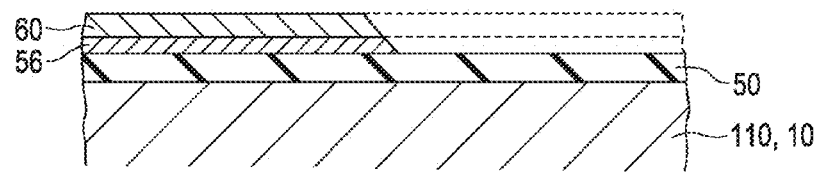

As shown in FIG. 5A, the first electrode 60 made of platinum is formed throughout the entire surface of the adhesion layer 56 by a sputtering method or a vapor deposition method. As shown in FIG. 5B, a resist (not shown) having a predetermined shape is formed on the first electrode 60 as a mask and the side surfaces of the adhesion layer 56 and the first electrode 60 are patterned to be slanted at the same time.

Next, after the resist is separated, the buffer layer 64 made of a compound having a pyrochlore structure that contains bismuth and platinum is formed on the first electrode 60. This buffer layer 64 can be formed by chemical solution methods such as a metal-organic decomposition (MOD) method, a sol-gel method, or the like, in which a solution having a metallic complex is coated, dried and, furthermore, burned at a high temperature to obtain the buffer layer 64 made of a metallic oxide. In addition, a laser ablation method, a sputtering method, a pulse laser deposition method (PLD method), a CVD method, an aerosol deposition method, or the like can be used to form the buffer layer 64.

Figure 5C:
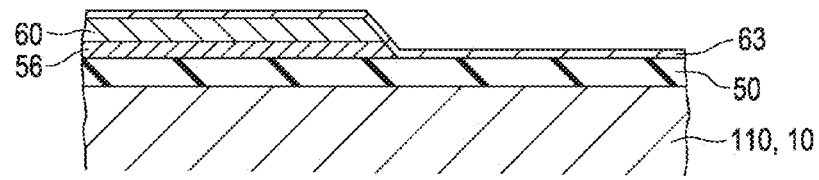

As a specific example of the procedure when the buffer layer 64 is formed by the chemical solution method, first, as shown in FIG. 5C, a buffer layer precursor film 63 is formed on the first electrode 60 made of Pt, by coating a buffer layer forming composition (buffer layer precursor solution) formed of a sol or an MOD solution containing a metallic complex, specifically, a metallic complex containing Bi and Fe, Co, Na, Mg, or the like as necessary by a spin coat method (buffer layer coating process).

The buffer layer precursor solution to be coated is obtained by mixing the metallic complexes that can be form the complex oxide having a pyrochlore structure that contains Bi and Fe, Co, Na, Mg or the like as necessary by burning and dissolving or dispersing the mixture in an organic solvent. Examples of metallic complexes respectively containing Bi and Fe, Co, Na, Mg or the like that can be used include alkoxides, organic acid salts, and β-diketone complexes. Examples of metallic complexes containing Bi include bismuth 2-ethylhexanoate, and bismuth acetate. Examples of metallic complexes containing Fe include iron 2-ethylhexanoate, iron acetate, iron tris(acetylacetonate). Examples of organic metallic compounds containing Co include cobalt 2-ethylhexanoate and cobalt (III) acetylacetonate. An example of an organic metallic compound containing Na includes sodium 2-ethylhexanoate. An example of an organic metallic compound containing Mg includes magnesium 2-ethylhexanoate. Naturally, metallic complexes containing two or more of Bi and Fe, Co, Na and Mg may be used. In addition, examples of solvents for the buffer layer precursor solution include propanol, butanol, pentanol, hexanol, octanol, ethylene glycol, propylene glycol, octane, decane, cyclohexane, xylene, toluene, tetrahydrofuran, acetic acid and octylic acid.

In this manner, to form the buffer layer 64 made of a compound having a pyrochlore structure that contains Bi and Pt, for example, a precursor solution including a metallic complex that contains Bi, Fe and Co, a precursor solution including a metallic complex that contains Bi, Fe and Na or a precursor solution including a metallic complex that contains Bi, Fe and Mg may be used and applied on the first electrode 60 made of Pt to carry out burning. The composition of a material in a precursor solution is not limited and each metal may be mixed to have a desired mole ratio. For example, in the case of a material containing Bi, Fe and Co, the mole ratio may be Bi:Fe:Co=80 to 120:80 to 120:0.5 to 30 and in the case of a material containing Bi, Fe and Na, the mole ratio may be Bi:Fe:Na=80 to 120:80 to 120:0.5 to 30. In case of a material containing Bi, Fe and Mg, the mole ratio may be Bi:Fe:Mg=80 to 120:80 to 120:0.5 to 30. The materials may not be used as long as the buffer layer 64 made of a compound having a pyrochlore structure that contains Bi and Pt can be formed.

Next, the buffer layer precursor film 63 is heated to a predetermined temperature (for example, 150 to 200° C.) and dried for a certain amount of time (buffer layer drying process). Next, the dried buffer layer precursor film 63 is heated to a predetermined temperature (for example, 350 to 450° C.) and retained for a certain amount of time, thereby carrying out delipidation (buffer layer delipidating process). Herein, the delipidation refers to separating the organic components included in the buffer layer precursor film 63 in the form of, for example, $NO_2$, $CO_2$, $H_2O$, and the like. The atmosphere of the buffer layer drying process or the buffer layer delipidating process is not limited, and the air, an oxygen atmosphere, or an inert gas may also be used.

Figure 5D:
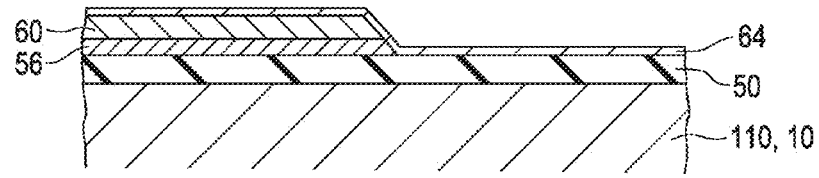

Next, as shown in FIG. 5D, the buffer layer precursor film 63 is heated to a predetermined temperature, for example, about 600 to 850° C. and retained for a certain amount of time, for example, for one minute to 10 minutes, thereby crystallizing the buffer layer precursor film 63 and forming a buffer layer 64 having the pyrochlore structure that contains bismuth and platinum (burning process). In the buffer layer burning process, Pt which forms the first electrode 60 and the constituent elements of the buffer layer precursor film 63 are mutually diffused so that the buffer layer 64 contains Pt as well as Bi. Then, in the pyrochlore structure, that is, an $A_2B_2O_7$ structure, Bi is mainly positioned in the A site and Pt is mainly positioned in the B site and the buffer layer 64 is presumed to have a structure in which $Bi_2Pt_2O_7$ and Bi or Pt of $Bi_2Pt_2O_7$ are substituted with other element (Co, Na, Mg or the like). For example, when a material containing Bi, Fe and Co is used as the buffer layer precursor solution, the buffer layer 64 made of a compound having a pyrochlore structure that contains Bi, Pt, Fe and Co can be formed. In addition, when a material containing Bi, Fe and Na is used, the buffer layer 64 made of a compound having a pyrochlore structure that contains Bi, Pt, Fe and Na can be formed. In addition, when a material containing Bi, Fe and Mg is used, the buffer layer 64 made of a compound having a pyrochlore structure that contains Bi, Pt, Fe and Mg can be formed.

Here, in the pyrochlore structure, a diffraction pattern derived from a (222) plane in the vicinity of 30° and a diffraction pattern derived from a (111) plane in the vicinity of 15° are observed by measuring the X-ray diffraction. In general, the diffraction peak derived from the (222) plane has the strongest peak intensity of a crystal having a pyrochlore structure and the diffraction peak derived from the (222) plane in $Bi_2Pt_2O_7$ is a strong peak. Accordingly, when the diffraction peak is large overall, the diffraction peak derived from the (222) plane and the diffraction peak derived from the (111) plane are detected. However, when the diffraction peak is weak in whole, only the diffraction peak derived from the (222) plane is detected and the diffraction peak derived from the (111) plane is not detected due to the noise in some cases.

In the embodiment, the buffer layer 64 is oriented to the (111) plane. Specifically, in the measurement by an X-ray diffraction apparatus (XRD), for example, a detector is fixed to $2\theta=32°$ and $\theta=16°$ which are positions in which the peak of the (110) plane is observed and scanning in the x direction is performed from 0 to 90°. In case of non-orientation, the detection intensity has a tendency of being maximum when $x=0°$ and gradually reduced. On the other hand, in the case of orientation, the peak caused by the orientation is shown. Due to this, the presence of the orientation other than the (110) plane can be confirmed. In addition, with regard to whether the (110) plane is oriented, for example, $\theta$ and $2\theta$ are fixed in the peak position of the (100) plane to perform the measurement in the same manner and confirm the peak. Then, it is possible to determine whether the (110) plane is oriented by whether the peak other than $x=0°$ is shown. Then, the observation of the stronger peak intensity of the (111) plane than the obtained peak intensity of the (111) plane in the case of the non-orientation means that "the buffer layer is oriented to the (111) plane".

In the buffer layer burning process, the atmosphere is not limited, and the air, an oxygen atmosphere, or an inert gas may also be used. An example of a heating apparatus which is used in the buffer layer drying process, the buffer layer delipidation process, and the buffer layer burning process includes a rapid thermal annealing (RTA) apparatus which carries out heating by irradiation of an infrared lamp, a hot plate, and the like.

In the embodiment, the coating process is carried out once and the buffer layer 64 is formed with one layer. However, the above-described buffer layer coating process, the buffer layer drying process, and the buffer layer delipidation process, or the buffer layer coating process, the buffer layer drying process, the buffer layer delipidation process, and the buffer layer burning process may be repeated plural times according to a desired film thickness and the like so as to form the buffer layer 64 formed with plural layers.

Next, an oxide layer 72 made of an oxide that contains Bi is formed on the buffer layer 64. The oxide layer 72 can be manufactured by, for example, coating and drying a solution including a metallic complex and carrying out delipidation. In addition, a laser ablation method, a sputtering method, a pulse laser deposition method (PLD method), a CVD method, an aerosol deposition method, or the like can be used to form the oxide layer 72.

Figure 6A:
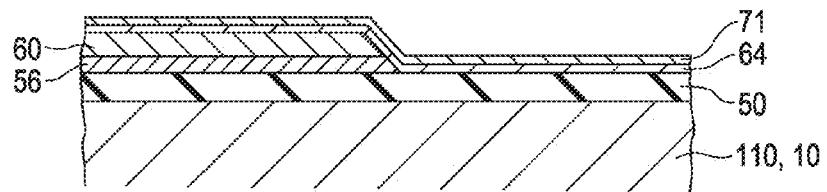
FIGS. 6A to 6D are cross-sectional views showing a process of manufacturing the recording head according to Embodiment 1.

As a specific example of the procedure when the oxide layer 72 is formed by the chemical solution method, first, as shown in FIG. 6A, an oxide layer precursor film (piezoelectric layer precursor film) 71 is formed on the buffer layer 64 by coating an oxide layer forming composition (precursor solution) composed of a sol or an MOD solution containing a metallic complex, specifically, a metallic complex containing Bi and Fe, Ba, Ti or the like as necessary by the spin coat method (coating process).

The precursor solution to be coated is obtained by mixing the metallic complexes that can be form the complex oxide that contains Bi and Fe, Ba, Ti or the like as necessary by burning and dissolving or dispersing the mixture in an organic solvent. When the complex oxide containing Mn, Co and Cr is formed, a precursor solution including a metallic complex containing Mn, Co and Cr is used. The metallic complexes respectively containing Bi and Fe, Ba, Ti, Mn, Co and Cr may be mixed so as to have a desired mixing ratio. Examples of metallic complexes respectively containing Bi, Fe, Ba, Ti, Mn, Co and Cr include alkoxides, organic acid salts, and β-diketone complexes. Examples of metallic complexes containing Bi include bismuth 2-ethylhexanoate, and bismuth acetate. Examples of metallic complexes containing Fe include iron 2-ethylhexanoate, iron acetate, iron tris(acetylacetonate). Examples of metallic complexes containing Ba include barium isopropoxide, barium 2-ethylhexanoate, and barium acetylacetonate. Examples of metallic complexes containing Ti include titanium isopropoxide, titanium 2-ethylhexanoate, and titanium(di-1-propoxide)bis(acetylacetonate). Examples of metallic complexes containing Mn include manganese 2-ethylhexanoate and manganese acetate. Examples of organic metallic compounds containing Co include cobalt 2-ethylhexanoate and cobalt (III) acetylacetonate. An example of an organic metallic compound including Cr includes chrome 2-ethylhexanoate. A metallic complex which contains two or more from Bi and Fe, Ba, Ti, Mn, Co or Cr may be used. In addition, examples of solvents for the precursor solution include propanol, butanol, pentanol, hexanol, octanol, ethylene glycol, propylene glycol, octane, decane, cyclohexane, xylene, toluene, tetrahydrofuran, acetic acid and octylic acid.

Figure 6B:
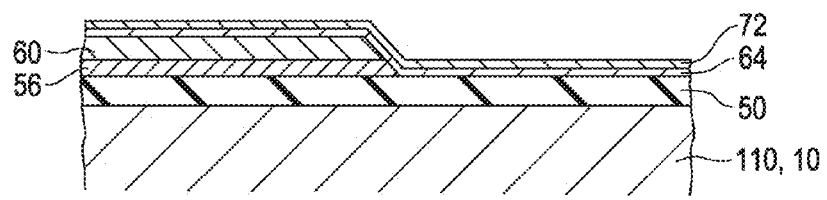

Next, the oxide layer precursor film 71 is heated to a predetermined temperature (for example, 150 to 200° C.) and dried for a certain amount of time (drying process). Next, the dried oxide layer precursor film 71 is heated to a predetermined temperature (for example, 350 to 450° C.) and retained for a certain amount of time, thereby carrying out delipidation (delipidating process). Therefore, the oxide layer 72 is formed as shown in FIG. 6B. Herein, the delipidation refers to separating the organic components included in the oxide layer precursor film 71 in the form of, for example, $NO_2$, $CO_2$, $H_2O$, and the like. The atmosphere of the drying process or the delipidating process is not limited, and the air, an oxygen atmosphere, or an inert gas may also be used. Furthermore, the coating process, the drying process and the delipidating process may be carried out plural times. When the oxide layer 72 is formed by the sputtering method, the delipidating process is carried out in the stage of sputtering, thereby forming the oxide layer 72.

Figure 6C:
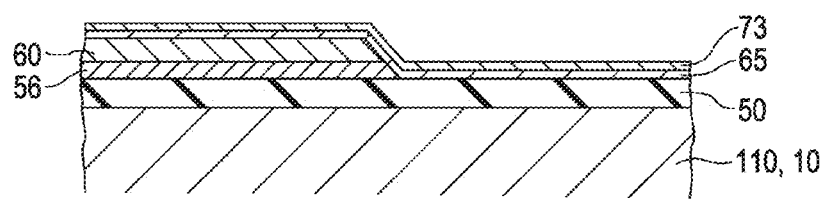

Next, as shown in FIG. 6C, the oxide layer 72 is heated to a predetermined temperature, for example, about 600 to 850° C. and retained for a certain amount of time, for example, for one minute to 10 minutes, thereby burning the oxide layer 72 (burning process). By doing this, the oxide layer 72 is crystallized to form a piezoelectric film 73 made of a complex oxide having a perovskite structure that contains Bi. The atmosphere of the burning process is not limited, and the air, an oxygen atmosphere, or an inert gas may also be used. An example of a heating apparatus which is used in the drying process, the delipidation process, and the burning process includes a rapid thermal annealing (RTA) apparatus which carries out heating by irradiation of an infrared lamp, a hot plate, and the like.

In the burning process of the oxide layer 72, the buffer layer 64 made of a compound having a pyrochlore structure is burned at the same time. In the embodiment, the buffer layer 64 becomes an oxide having a perovskite structure by the burning process of the oxide layer 72. Naturally, the pyrochlore structure may be left as is. In either case, the buffer layer 64 after the burning process of oxide layer 72 is referred to as a buffer layer burning layer 65. That is, the buffer layer burning layer 65 is formed through the buffer layer 64 which is made of a compound having a pyrochlore structure that is presumed to have a structure in which $Bi_2Pt_2O_7$ and Bi or Pt of $Bi_2Pt_2O_7$ are substituted with other element (Co, Na, Mg or the like).

Figure 6D:
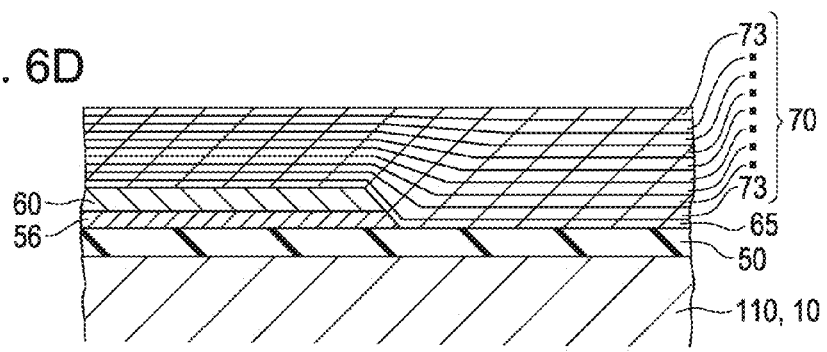

Next, the above-mentioned coating process, the drying process, and the delipidation process, or the coating process, the drying process, the delipidation process, and the burning process are repeated plural times according to a desired film thickness and the like so as to form the piezoelectric layer 70 made of plural piezoelectric films 73, thereby forming the piezoelectric layer 70 with a predetermined thickness which is made of plural layers of the piezoelectric films 73 as shown in FIG. 6D. For example, when the film thickness is about 0.1 µm for one cycle of a coating solution, the entire film thickness of the piezoelectric layer 70 made of 10 layers of the piezoelectric films 73 becomes, for example, about 1.1 µm. While the piezoelectric layer is provided by laminating the piezoelectric films 73 in the embodiment, the piezoelectric layer may be only one layer.

When the buffer layer 64 made of a compound having a pyrochlore structure is formed in this manner, a layer which is made of a piezoelectric material that contains Bi (piezoelectric layer 70 in the embodiment) and is formed on the buffer layer 64 can have remarkably high crystallinity in comparison with a case where a layer is not formed on the buffer layer made of a compound having a pyrochlore structure. This is because it is presumed that the perovskite structure of the piezoelectric layer 70 containing Bi and formed on the buffer layer is promoted by the buffer layer 64 made of a compound having a pyrochlore structure. Since the piezoelectric layer 70 manufactured in the invention in this manner has high crystallinity, an amount of displacement is improved.

Figure 7A:
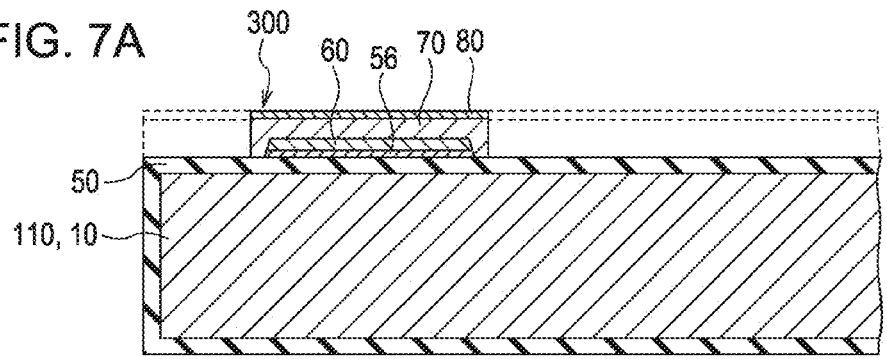
FIGS. 7A to 7C are cross-sectional views showing a process of manufacturing the recording head according to Embodiment 1.

After the piezoelectric layer 70 is formed, the second electrode 80 made of platinum or the like is formed on the piezoelectric layer 70 by the sputtering method or the like as shown in FIG. 7A, and the buffer layer burning layer 65, the piezoelectric layer 70 and the second electrode 80 are patterned at the same time in the region facing each of the pressure generating chambers 12, thereby forming the piezoelectric element 300 having the first electrode 60, the piezoelectric layer 70, and the second electrode 80. Meanwhile, the patterning of the buffer layer burning layer 65, the piezoelectric layer 70 and the second electrode 80 can be collectively carried out by dry etching through a resist formed into a predetermined shape (not shown). After that, annealing may be carried out in a temperature range of, for example, 600 to 850° C. as necessary. Accordingly, favorable interfaces between the piezoelectric layer 70, and the buffer layer burning layer 65, the first electrode 60, or the second electrode 80 can be formed and the crystallinity of the piezoelectric layer 70 can be improved.

Figure 7B:
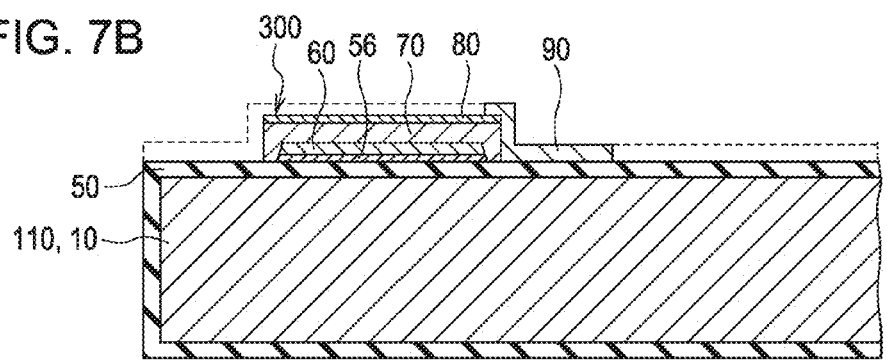

Next, as shown in FIG. 7B, after the lead electrode 90 made of, for example, gold (Au) or the like is formed throughout the entire surface of the flow passage forming substrate wafer 110, patterning is carried out for each piezoelectric element 300 through, for example, a mask pattern (not shown) formed of a resist and the like.

Figure 7C:
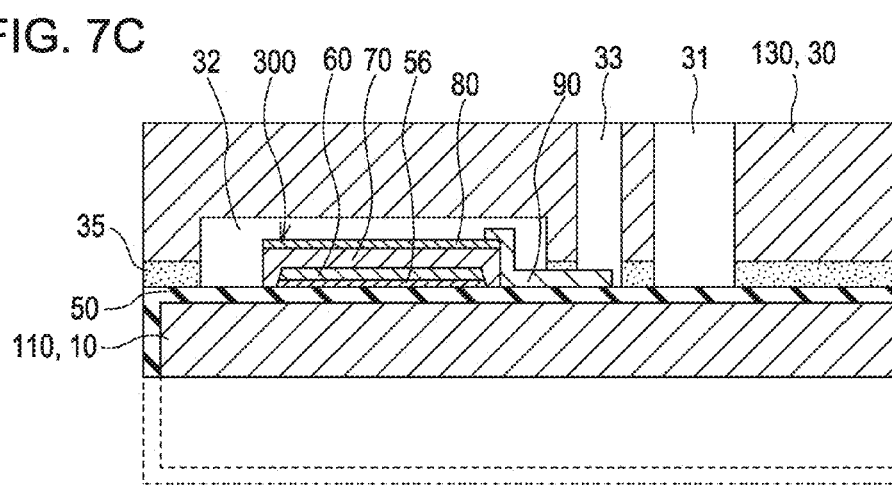

Next, as shown in FIG. 7C, after a protective substrate wafer 130 formed of the plural protective substrates 30 which are silicon wafers is bonded to the piezoelectric element 300 side of the flow passage forming substrate wafer 110 with the adhesive 35, the flow passage forming substrate wafer 110 is made thin to have a predetermined thickness.

Figure 8A:
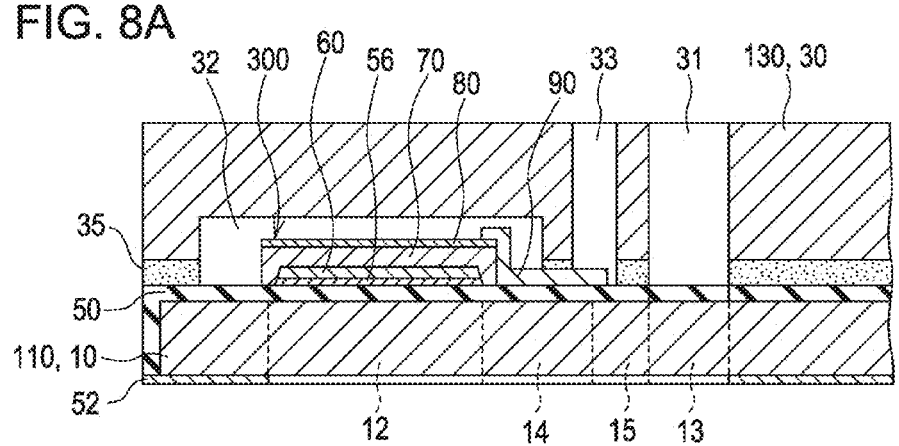
FIGS. 8A and 8B are cross-sectional views showing a process of manufacturing the recording head according to Embodiment 1.

Next, as shown in FIG. 8A, a mask film 52 is newly formed on the flow passage forming substrate wafer 110 and is patterned into a predetermined shape.

Figure 8B:
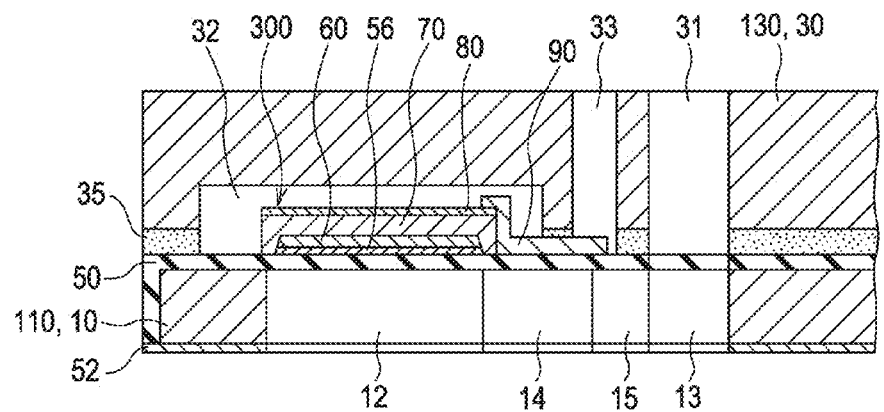

Then, as shown in FIG. 8B, the pressure generating chambers 12, the communication portion 13, the ink supply path 14, the communication path 15, and the like, which correspond to the piezoelectric elements 300, are formed by carrying out anisotropic etching (wet etching) on the flow passage forming substrate wafer 110 through the mask film 52 using an alkali solution such as KOH.

After that, unnecessary portions in the outer circumferential portions of the flow passage forming substrate wafer 110 and the protective substrate wafer 130 are removed by carrying out cutting using, for example, a dicing. Moreover, after the mask film 52 on the surface of the flow passage forming substrate wafer 110 on the opposite side of the protective substrate wafer 130 is removed, the nozzle plate 20 which has the punctured nozzle openings 21 is bonded and along with this, the compliance substrate 40 is bonded to the protective substrate wafer 130, and the flow passage forming substrate wafer 110 and the like are divided into the flow passage forming substrate 10 and the like of one chip size as shown in FIG. 1, thereby manufacturing the ink jet type recording head I of the embodiment.

EXAMPLES

Hereinafter, examples will be shown and the invention will be described more specifically. In addition, the invention is not limited to the following examples.

Example 1

First, a silicon dioxide ($SiO_2$) film having a thickness of 1200 nm was formed on the surface of a (100)-oriented single crystal silicon (Si) substrate by thermal oxidation. Next, a titanium film having a thickness of 40 nm was formed on the $SiO_2$ film by the RF magnetron sputtering method, and thermally oxidized to form a titanium oxide film. Next, a (111)-oriented platinum film (first electrode 60) having a thickness of 100 nm was formed on the titanium oxide film by the RF magnetron sputtering method.

Next, the buffer layer 64 made of a compound having a pyrochlore structure that contains Bi and Pt was formed on the first electrode 60. The method is as follows. First, the n-octane solutions of bismuth 2-ethylhexanoate, iron 2-ethylhexanoate, and cobalt 2-ethylhexanoate were mixed so that the mole ratio of each element is Bi:Fe:Co=100:85:15, thereby preparing a buffer layer precursor solution.

In addition, the buffer layer precursor solution was dropped on the substrate on which the titanium oxide film and the platinum film were formed, and the substrate was rotated at 3000 rpm, thereby forming the buffer layer precursor film 63 by the spin coat method (buffer layer coating process). Next, the substrate was dried on a hot plate at 180° C. for 2 minutes (buffer layer drying process). Next, the substrate is mounted on the hot plate and delipidation was carried out at 350° C. for 2 minutes (buffer layer delipidating process). After that, the temperature was increased to 750° C. at a rate of 400° C. per second and burning was carried out in an oxygen atmosphere by rapid thermal annealing (RTA) apparatus at 750° C. for 2 minutes, thereby forming the buffer layer 64 made of a compound having a pyrochlore structure that contains bismuth and platinum (buffer layer burning process).

Next, the oxide layer 72 is formed on the buffer layer 64. The method is as follows. First, each of the n-octane solutions of bismuth 2-ethlyhexonate, iron 2-ethylhexonate, barium 2-ethlyhexonate and titanium 2-ethlyhexonate were mixed so that the mole ratio of each element is Bi:Ba:Fe:Ti=75:25:75:25 thereby preparing a precursor solution.

In addition, the buffer layer precursor solution was dropped on the buffer layer 64 and the substrate was rotated at 3000 rpm, thereby forming the oxide layer precursor film 71 by the spin coat method (coating process). Next, the substrate was dried on a hot plate at 180° C. for 2 minutes (drying process). Next, the substrate was mounted on the hot plate, and delipidation was carried out at 350° C. for 2 minutes to form the oxide layer 72 (delipidating process).

Then, the temperature is increased to 750° C. at a rate of 400° C. per second and burning was carried out in an oxygen atmosphere by rapid thermal annealing (RTA) apparatus at 750° C. for 2 minutes, thereby crystallizing on the oxide layer 72 and forming the piezoelectric layer 70 made of the complex oxide having the perovskite structure that contains Bi, Fe, Ba and Ti (burning process). In the burning process of the oxide layer 72, the buffer layer 64 was also burned at the same time to form the buffer layer burning layer 65. The thickness of the piezoelectric layer 70 was 80 nm and the thickness of the buffer layer burning layer 65 was 20 nm.

Example 2

The same operation as in Example 1 was carried out except that a solution in which n-octane solutions of bismuth 2-ethlyhexonate, iron 2-ethylhexonate and sodium 2-ethlyhexonate were mixed so that the mole concentration ratio of each element is Bi:Fe:Na=100:100:10 was used as a buffer layer precursor solution.

Example 3

The same operation as in Example 1 was carried out except that a solution in which n-octane solutions of bismuth 2-ethlyhexonate, iron 2-ethylhexonate and magnesium 2-ethlyhexonate were mixed so that the mole concentration ratio of each element is Bi:Fe:Mg=100:100:10 was used as a buffer layer precursor solution.

Comparative Example 1

The same operation as in Example 1 was carried out except that a buffer layer was directly formed on a (100)-oriented single crystal silicon (Si) substrate without forming an $SiO_2$ film, a titanium oxide film and a platinum film.

Comparative Example 2

The same operation as in Example 1 was carried out except that a buffer layer was directly formed on a titanium oxide without forming a platinum film.

Test Example 1

With regard to Examples 1 to 3 and Comparative Examples 1 and 2, in the stage of forming the buffer layer 64, an X-ray is emitted from the formed buffer layer 64 side using a D8 DISCOVER, an X-ray diffraction apparatus manufactured by Bruker AXS, using copper as the X-ray source, and using a two-dimensional detector as a detector at room temperature (25° C.) so that the two-dimensional X-ray diffraction patterns of the buffer layer 64 were obtained. In addition, the two-dimensional X-ray diffraction patterns were integrated in the x direction. The results of integrating the two-dimensional X-ray diffraction patterns in the x direction are shown in views showing correlations with diffraction intensities and diffraction angles 2θ.

Moreover, in the stage of forming the piezoelectric layer 70, that is, in the stage after the oxide layer 72 is formed and burned, under the same measurement condition in which the two-dimensional X-ray diffraction patterns of the above-described buffer layer 64 were obtained, the two-dimensional X-ray diffraction patterns of the piezoelectric layer 70 and the buffer layer burning layer 65 were obtained to integrate the two-dimensional X-ray diffraction patterns in the x direction.

Figure 9A:
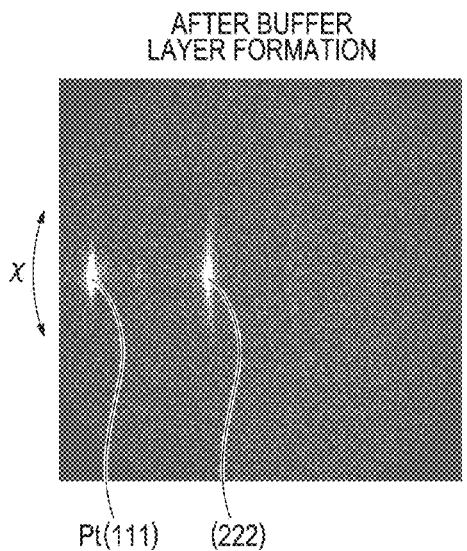
FIGS. 9A and 9B are views showing two-dimensional X-ray diffraction patterns of Example 1.
Figure 9B:
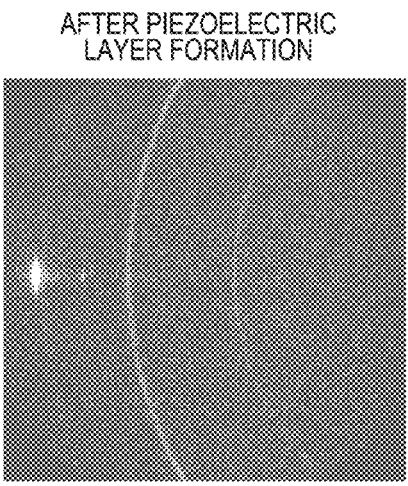
Figure 10:
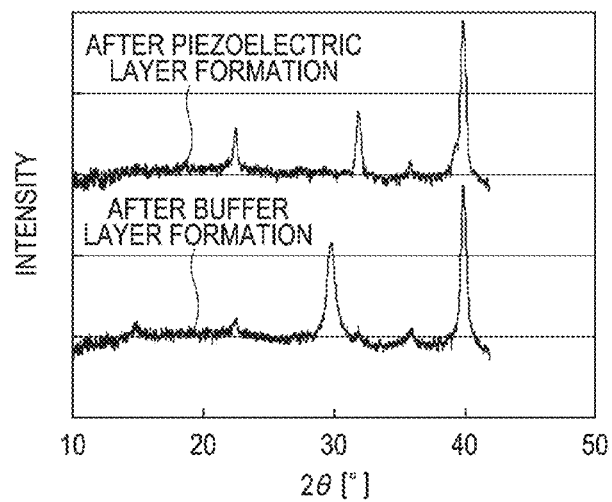
FIG. 10 is a graph showing a result of integrating two-dimensional X-ray diffraction patterns of Example 1 in the x direction.

With regard to the obtained results, the two-dimensional X-ray diffraction patterns in the stage of forming the buffer layer 64 in Example 1 (referred to as "after buffer layer formation" in the drawing) are shown in FIG. 9A, the two-dimensional X-ray diffraction patterns in the stage of forming the piezoelectric layer 70 (referred to as "after piezoelectric layer formation" in the drawing) are shown in FIG. 9B, and the result of respectively integrating the two-dimensional X-ray diffraction patterns of FIGS. 9A and 9B in the x direction are shown in FIG. 10.

Figure 11A:
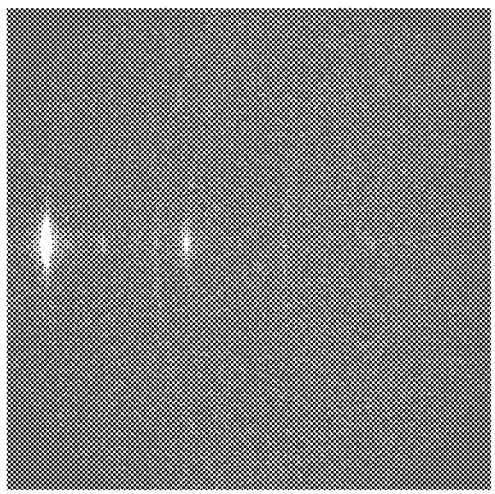
FIGS. 11A and 11B are views showing two-dimensional X-ray diffraction patterns of Example 2.
Figure 11B:
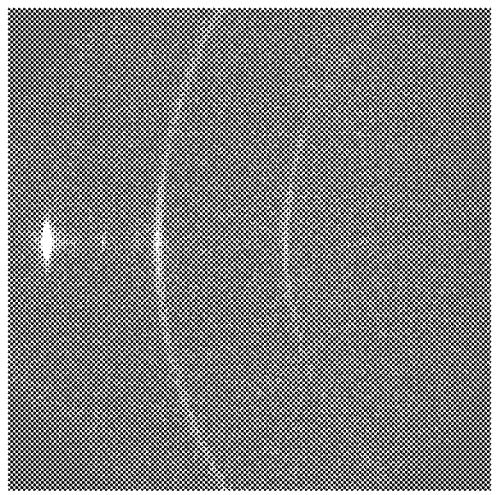
Figure 12:
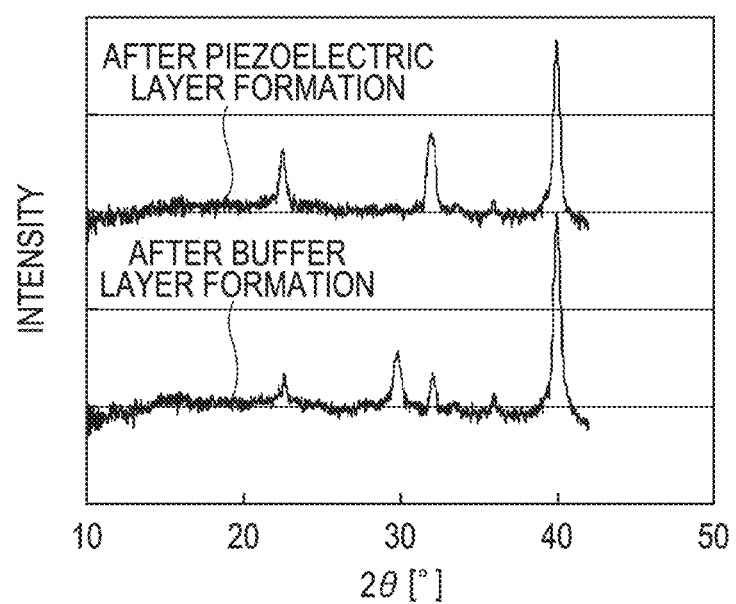
FIG. 12 is a graph showing a result of integrating two-dimensional X-ray diffraction patterns of Example 2 in an x direction.

In addition, the two-dimensional X-ray diffraction patterns in the stage of forming the buffer layer 64 in Example 2 are shown in FIG. 11A, the two-dimensional X-ray diffraction patterns in the stage of forming the piezoelectric layer 70 are shown in FIG. 11B, and the result of respectively integrating the two-dimensional X-ray diffraction patterns of FIGS. 11A and 11B in the x direction is shown in FIG. 12.

Figure 13A:
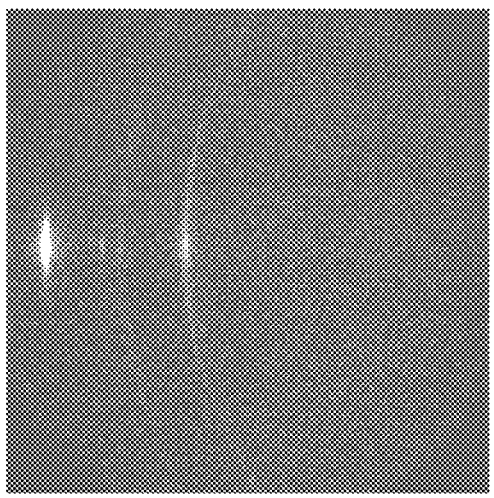
FIGS. 13A and 13B are views showing two-dimensional X-ray diffraction patterns of Example 3.
Figure 13B:
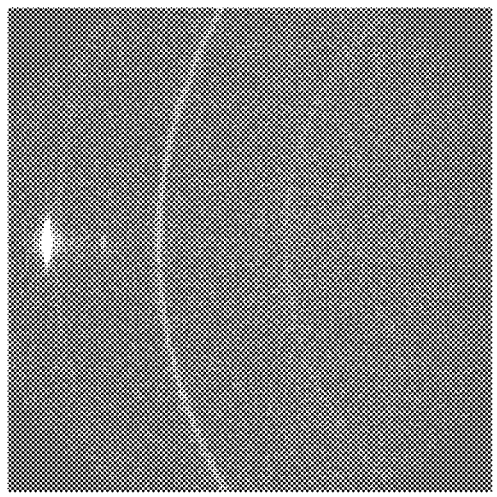
Figure 14:
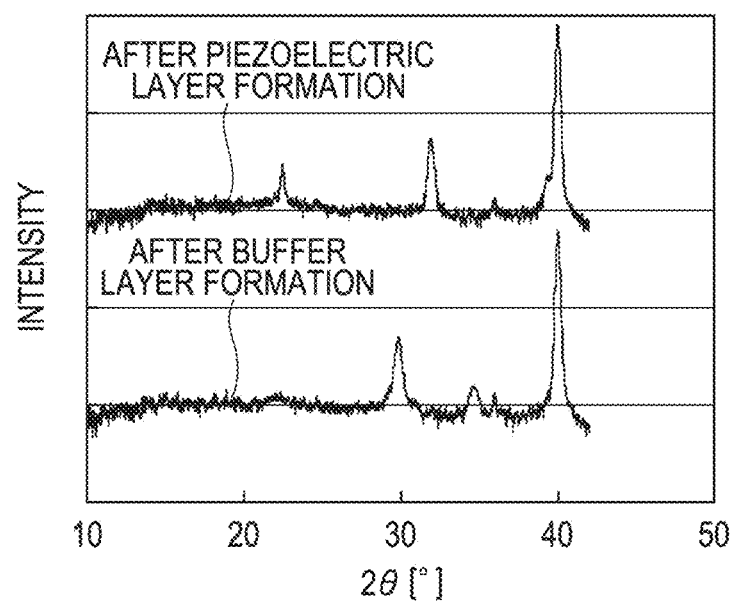
FIG. 14 is a graph showing a result of integrating two-dimensional X-ray diffraction patterns of Example 3 in an x direction.

In Example 3, the two-dimensional X-ray diffraction patterns in a stage of forming the buffer layer 64 are shown in FIG. 13A, the two-dimensional X-ray diffraction patterns in the stage of forming the piezoelectric layer 70 are shown in FIG. 13B and the result of respectively integrating the two-dimensional X-ray diffraction patterns in FIG. 13A and FIG. 13B in the x direction is shown in FIG. 14.

Figure 15A:
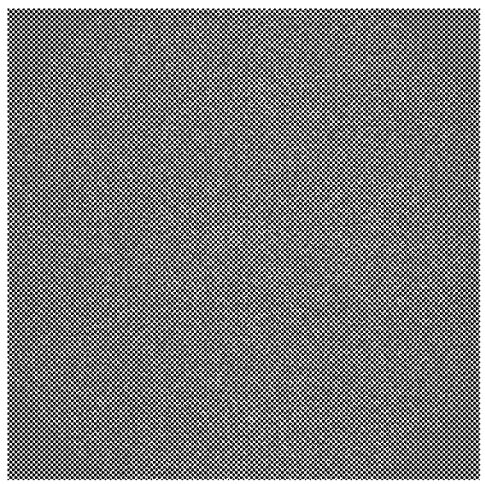
FIGS. 15A and 15B are views showing two-dimensional X-ray diffraction patterns of Comparative Example 1.
Figure 15B:
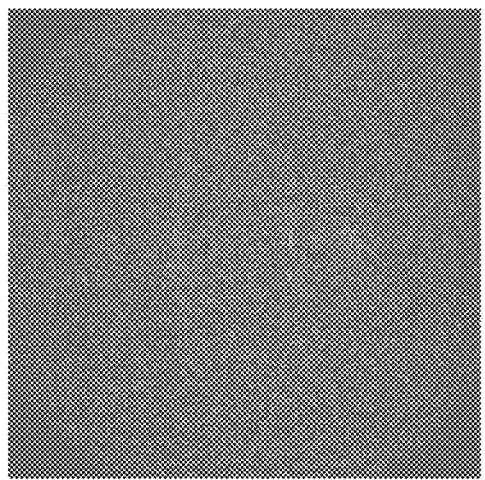
Figure 16:
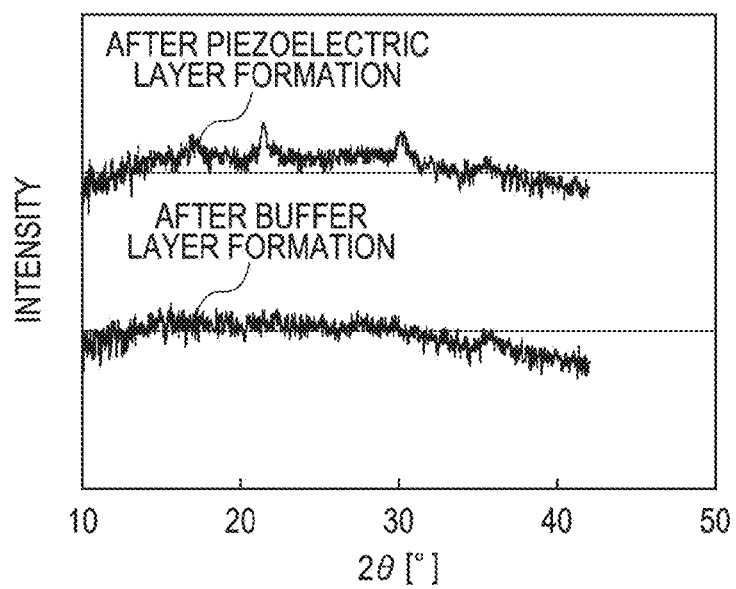
FIG. 16 is a graph showing a result of integrating two-dimensional X-ray diffraction patterns of Comparative Example 1 in the x direction.

In Comparative Example 1, the two-dimensional X-ray diffraction patterns in the stage of forming the buffer layer 64 are shown in FIG. 15A, the two-dimensional X-ray diffraction patterns in the stage of forming the piezoelectric layer 70 are shown in FIG. 15B, and the result of respectively integrating the two-dimensional X-ray diffraction patterns in FIG. 15A and FIG. 15B in the x direction is shown in FIG. 16.

Figure 17A:
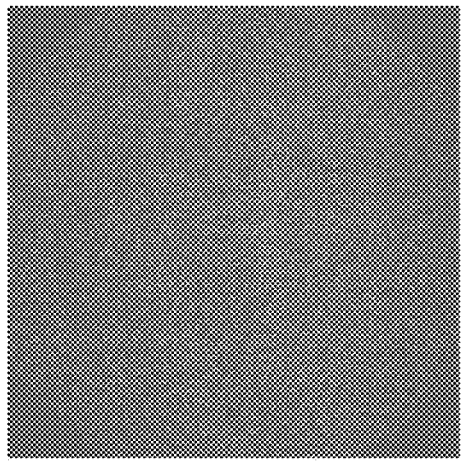
FIGS. 17A and 17B are views showing two-dimensional X-ray diffraction patterns of Comparative Example 2.
Figure 17B:
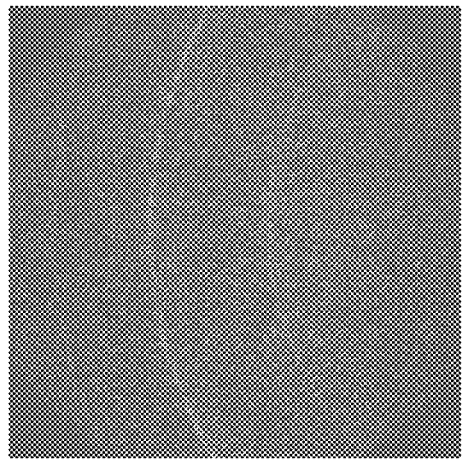
Figure 18:
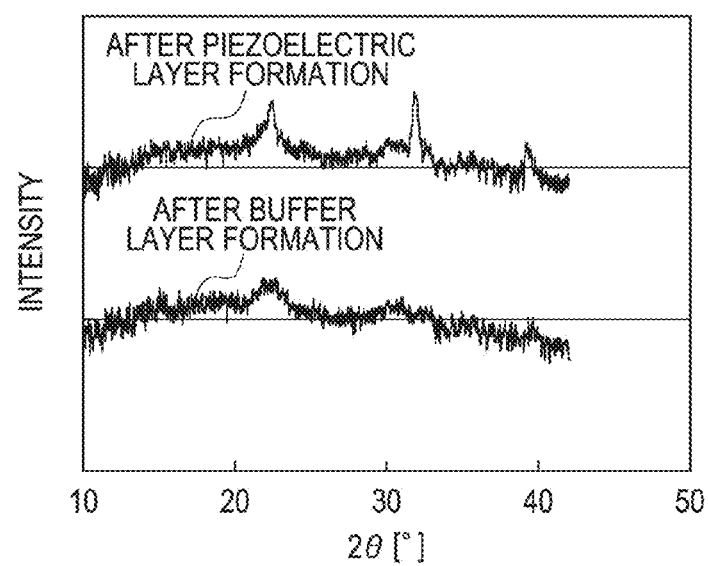
FIG. 18 is a graph showing a result of integrating two-dimensional X-ray diffraction patterns of Comparative Example 2 in the x direction.

In Comparative Example 2, the two-dimensional X-ray diffraction patterns in the stage of forming the buffer layer 64 are shown in FIG. 17A, the two-dimensional X-ray diffraction patterns in the stage of forming the piezoelectric layer 70 are shown in FIG. 17B, and the result of integrating FIG. 17A and FIG. 17B respectively in the x direction is shown in FIG. 18.

As a result, as shown in FIG. 10 which is a graph showing the result of integrating the two-dimensional X-ray diffraction patterns of Example 1 in the x direction, in the stage of forming the buffer layer 64, the peak derived from the pyrochlore structure, specifically, the peak derived from the (222) plane in the vicinity of 30° and the peak derived from the (111) plane in the vicinity of 15°, are observed. However, in the stage of forming the piezoelectric layer 70, although no crystalline phase of the pyrochlore structure is observed, a crystalline phase of the perovskite structure is observed. Furthermore, in FIG. 9A which is view showing two-dimensional X-ray diffraction patterns in the stage of forming the buffer layer 64, it has been found that the pyrochlore structure of the buffer layer 64 is oriented to the (111) plane by forming a spot shape at the position of 2θ on the (222) plane of the pyrochlore structure. Meanwhile, in FIG. 9B which is view showing two-dimensional X-ray diffraction patterns in the stage of forming the piezoelectric layer 70, it has been found that the pyrochlore structure is annihilated since no spot at the position of 2θ of the (222) plane observed in FIG. 9A is observed. That is, it has been found that the buffer layer 64 formed in the initial burning (buffer layer burning process) has a pyrochlore structure, and the crystal of the buffer layer 64 is changed to the perovskite structure in the subsequent burning of the oxide layer 72 (burning process). In addition, it has been found that, in the stage of forming the piezoelectric layer 70, the piezoelectric layer 70 and the buffer layer burning layer 65 are made of the compounds respectively having the perovskite structure since the crystalline phase of the pyrochlore structure is not observed but the crystalline phase of the perovskite structure is observed.

As shown in FIGS. 11A to 14, it is understood that Example 2 and Example 3 had a same result as in Example 1, the buffer layer 64 formed in the initial burning (buffer layer burning process) has the pyrochlore structure, and the crystal of the buffer layer 64 is changed to the perovskite structure in the subsequent burning of the oxide layer 72 (burning process). Furthermore, the piezoelectric layer 70 and the buffer layer burning layer 65 are made of the compounds respectively having the perovskite structure.

In Comparative Examples 1 and 2, in the stage of forming the buffer layer 64, the peak derived from the pyrochlore structure was not observed. Furthermore, in Comparative Examples 1 and 2, in the stage of forming the piezoelectric layer 70, although no crystalline phase of the pyrochlore structure was observed, the perovskite structure was slightly observed. However, the peak intensity of the crystal having the perovskite structure was very weak.

Herein, the constituent elements of the structure in Example 1 are Si, Bi, Fe, Co, Pt and Ti, the constituent elements of the structure in Comparative Example 1 are Si, Bi, Fe and Co and the constituent elements of the structure in Comparative Example 2 are Si, Bi, Fe, Ti and Co. When the constituent elements of the pyrochlore structure of the buffer layer 64 in Example 1 are considered, only Bi becomes a candidate in the A site in terms of a variable size of an ion radius and Pt becomes a candidate in the B site in the pyrochlore structure when it is determined in terms of the difference among the constituent elements in Example 1 and Comparative Examples 1 and 2. Accordingly, the buffer layer 64 made of a compound having a pyrochlore structure in Example 1 contains Bi and Pt and has a structure in which $Bi_2Pt_2O_7$ and Bi or Pt of $Bi_2Pt_2O_7$ are substituted with Co in Example 1, Na in Example 2, Mg in Example 3 and the like. It has been found that the buffer layer 64 has a compound containing Bi and Pt from the results of integrating the two-dimensional X-ray diffraction patterns in the x direction in Examples 1 to 3.

Then, as shown in FIGS. 9A to 18, it was recognized that the peak intensity and crystallinity were higher in Examples 1 to 3 in which the piezoelectric layer 70 was formed after the buffer layer 64 made of a compound having a pyrochlore structure that contains Bi and Pt was formed on the first electrode 60 made of Pt than in Comparative Examples 1 and 2 in which the buffer layer 64 made of a compound having a pyrochlore structure was not formed.

From the above, it has been found that the buffer layer 64 made of a compound having a pyrochlore structure that contains Bi and Pt has an effect of promoting formation of the perovskite structure in the piezoelectric layer 70 that contains Bi formed thereon.

Other Embodiments

Thus far, an embodiment of the invention has been described, but the basic configuration of the invention is not limited to the above. For example, in the above-described embodiment, a silicon single crystal substrate is exemplified as the flow passage forming substrate 10, but the flow passage forming substrate is not limited thereto, and, for example, materials, such as an SOI substrate and glass, may be used.

Furthermore, the above embodiment exemplified the piezoelectric element 300 in which the first electrode 60, the piezoelectric layer 70, and the second electrode 80 are sequentially laminated on a substrate (the flow passage forming substrate 10), but the piezoelectric element is not limited thereto, and, for example, it is possible to apply the invention even to a vertical vibration-type piezoelectric element in which a piezoelectric material and an electrode forming material are laminated alternately so as to extend or contract the piezoelectric element in the shaft direction.

Figure 19:
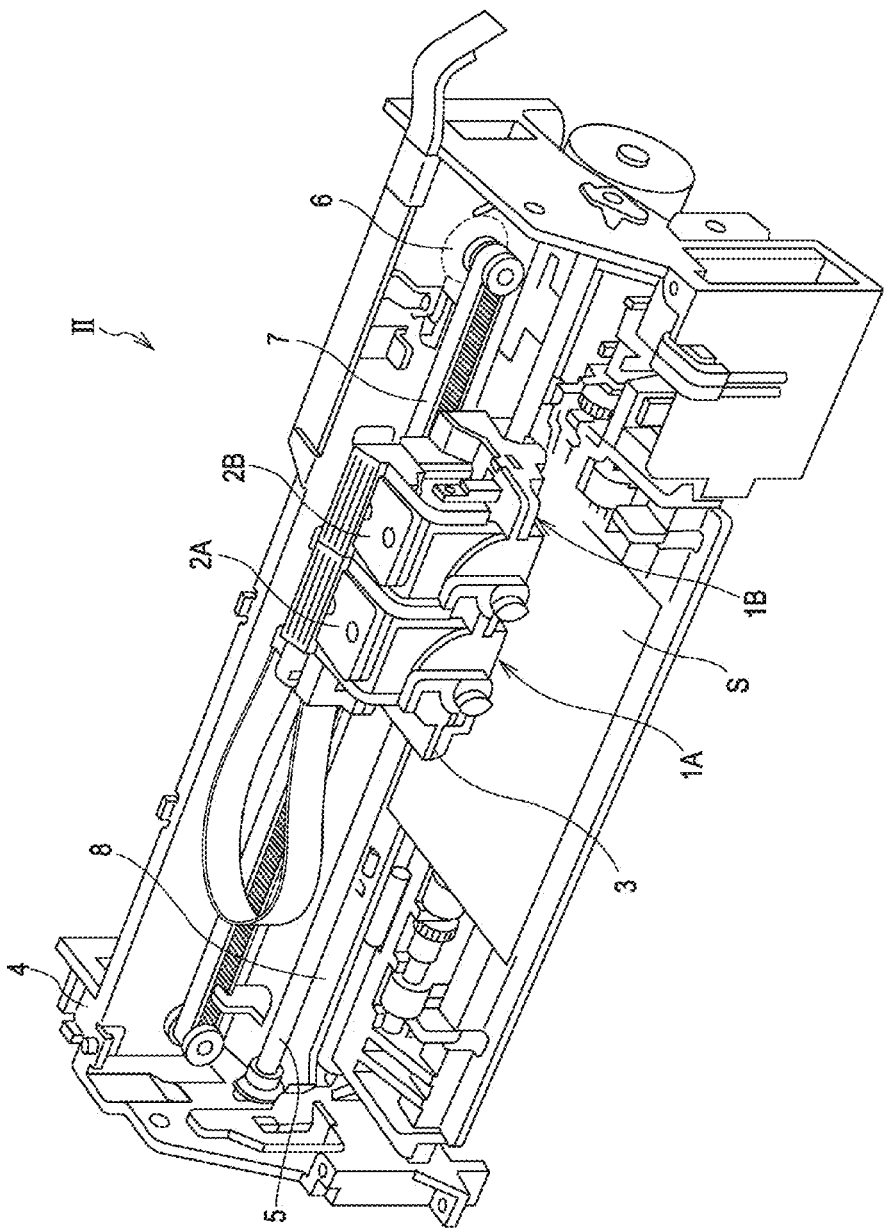
FIG. 19 is a schematic view showing a configuration of a recording apparatus according to an embodiment of the invention.

In addition, the ink jet type recording head of the embodiment configures a part of the recording head unit provided with ink flow passage communicated with an ink cartridge and the like, and is mounted on an ink jet type recording apparatus. FIG. 19 is a schematic view showing an example of the ink jet type recording apparatus.

In the ink jet type recording apparatus II shown in FIG. 19, recording head units 1A and 1B having the ink jet type recording head I are provided so that cartridges 2A and 2B configuring an ink supplying unit can be mounted and removed, and a carriage 3 having the recording head units 1A and 1B mounted thereon is provided so that the carriage can freely move along the carriage shaft 5 that is attached to an apparatus main body 4 in the shaft direction. The recording head units 1A and 1B discharge a black ink composition and a color ink composition, respectively.

When the driving force of a driving motor 6 is transferred to the carriage 3 through plural gears (not shown) and a timing belt 7, the carriage 3 on which the recording head units 1A and 1B are mounted is moved along the carriage shaft 5. On the other hand, the apparatus main body 4 includes a platen 8 along the carriage shaft 5 and a recording sheet S which is a recording medium such as paper fed by a feed roller (not shown) is rolled on the platen 8 to be transported.

Meanwhile, the above embodiment has been exemplified the ink jet type recording head as an example of the liquid ejecting head, but the invention can be applied to a wide range of liquid ejecting heads, and, naturally, can be applied even to liquid ejecting heads that eject liquid other than ink. Examples of other liquid ejecting heads include a variety of recording heads that are used in an image recording apparatus, such as a printer, color material ejecting heads used to manufacture color filters, such as liquid crystal displays, electrode material ejecting heads used to form electrodes, such as organic EL displays, field emission displays (FED), biological organic substance ejecting heads used to manufacture bio chips, and the like.

In addition, the piezoelectric elements according to the invention are not limited to the piezoelectric elements used in the liquid ejecting head and can be applied to other apparatuses. As other apparatuses, there may be ultrasonic apparatuses such as ultrasonic transmitters, ultrasonic motors, temperature-electric transducers, pressure-electric transducers, ferroelectric transistors, piezoelectric transformers, and filters such as filters for blocking harmful rays such as infrared rays, optical filters using a photonic crystal effect by forming quantum dots and optical filters using optical interference of a thin film. In addition, the invention can be applied to piezoelectric elements used as sensors and piezoelectric elements used as ferroelectric memories. As sensors in which piezoelectric elements are used, there may be infrared sensors, ultrasound sensors, heat sensitive sensors, pressure sensors, pyroelectric sensors, gyro sensors (angular velocity sensors) and the like.

What is claimed is:

1. A method of manufacturing a liquid ejecting head comprising:
    forming a first electrode made of platinum;
    forming a buffer layer made of a compound having a pyrochlore structure that contains bismuth (Bi) or platinum (Pt) on the first electrode;
    forming an oxide layer made of an oxide containing bismuth on the buffer layer;
    forming a piezoelectric layer made of a compound having a perovskite structure that contains bismuth by burning the oxide layer; and
    forming a second electrode on the piezoelectric layer.

2. The method of manufacturing a liquid ejecting head according to claim 1,
    wherein the buffer layer is made of the compound in which Bi is positioned in an A site and Pt is positioned in a B site in the pyrochlore structure.

3. A method of manufacturing a liquid ejecting apparatus comprising:
    manufacturing a liquid ejecting head by the method of manufacturing a liquid ejecting head according to claim 1.

4. A method of manufacturing a liquid ejecting head comprising:
    forming a liquid ejecting head by the method of manufacturing a liquid ejecting head according to claim 2.

5. A method of manufacturing a piezoelectric element comprising:
    forming a first electrode made of platinum;
    forming a buffer layer made of a compound having a pyrochlore structure that contains bismuth (Bi) or platinum (Pt) on the first electrode;
    forming an oxide layer made of an oxide containing bismuth on the buffer layer;
    forming a piezoelectric layer made of a compound having a perovskite structure that contains bismuth by burning the oxide layer; and
    forming a second electrode on the piezoelectric layer.

* * * * *